United States Patent [19]

Takami et al.

[11] Patent Number: 5,126,818
[45] Date of Patent: Jun. 30, 1992

[54] SEMICONDUCTOR DEVICE

[75] Inventors: Shigenari Takami; Tatsuhiko Irie; Jiro Hashizume; Yoshimasa Himura; Mitsuhiro Kani; Nobolu Yamaguchi, all of Kadoma, Japan

[73] Assignee: Matsushita Electric Works, Ltd., Osaka, Japan

[21] Appl. No.: 504,028

[22] Filed: Apr. 2, 1990

Related U.S. Application Data

[63] Continuation of Ser. No. 196,480, May 20, 1988, abandoned.

[30] Foreign Application Priority Data

May 26, 1987 [JP] Japan .................. 62-129195
Oct. 9, 1987 [JP] Japan .................. 62-256007
Oct. 27, 1987 [JP] Japan .................. 62-271137

[51] Int. Cl.$^5$ .................. H01L 21/60; H01L 3/00
[52] U.S. Cl. .................. 357/68; 357/80; 357/65; 357/70; 437/183
[58] Field of Search .................. 357/74, 80, 70, 65, 357/68, ; 437/183

[56] References Cited

U.S. PATENT DOCUMENTS

| | | | |
|---|---|---|---|
| 3,328,650 | 6/1967 | Boyer | 357/74 |
| 3,589,000 | 6/1971 | Galli | 357/68 |
| 3,591,839 | 7/1971 | Evans | 357/68 |
| 3,730,969 | 5/1973 | Buttle et al. | |
| 4,001,859 | 1/1977 | Miyoshi et al. | 357/68 |
| 4,081,901 | 4/1978 | Miller | 437/183 |
| 4,143,385 | 3/1979 | Miyoshi et al. | 357/68 |
| 4,179,802 | 12/1979 | Joshi et al. | 437/183 |
| 4,193,082 | 3/1980 | Dougherty | |
| 4,231,154 | 11/1980 | Gazdik et al. | 357/75 |
| 4,338,577 | 7/1982 | Sato | 372/36 |
| 4,396,457 | 8/1983 | Bakermans | 437/183 |
| 4,577,398 | 3/1986 | Sliwa | 357/80 |
| 4,791,075 | 12/1988 | Lin | 437/209 |
| 4,803,546 | 2/1989 | Sugimoto | 357/81 |
| 4,953,005 | 8/1990 | Carlson et al. | 357/74 |

FOREIGN PATENT DOCUMENTS

| | | | |
|---|---|---|---|
| 0252272 | 12/1987 | Fed. Rep. of Germany | 357/75 |
| 55-29584 | 8/1980 | Japan | 357/80 |
| 58-148434 | 9/1983 | Japan | 437/183 |
| 59-125641 | 7/1984 | Japan | 357/74 |
| 59-154035 | 9/1984 | Japan | 437/183 |
| 61-244035 | 10/1986 | Japan | 437/183 |
| 124748 | 6/1987 | Japan . | |
| 62-283647 | 12/1987 | Japan | 357/74 |
| 63-126258 | 5/1988 | Japan . | |

OTHER PUBLICATIONS

Balderes et al "Heat dissipation from IC chips through module package", IBM TDB, vol. 19, No. 11 1977, pp. 4165–4166.
"High performance multi-chip module", IBM TDB, vol. 30, No. 6 Nov./87, pp. 437–439.
"Improved area array surface mount module package" IBM TDB, vol. 32, No. 9B, Feb./90, pp. 64–65.

Primary Examiner—Andrew J. James
Assistant Examiner—Viet Q. Nguyen
Attorney, Agent, or Firm—Burns, Doane, Swecker & Mathis

[57] ABSTRACT

A semiconductor device includes a circuit pattern of a conductive thin film formed on a ceramic substrate by means of an etching, and an IC chip connected to the etched circuit pattern through a gang-bonding in which respective pads of conduction parts of the circuit pattern and of the IC chip directly contact with each other. The circuit pattern can be thereby provided densely, and contributive to a higher integration of the IC chip.

4 Claims, 4 Drawing Sheets

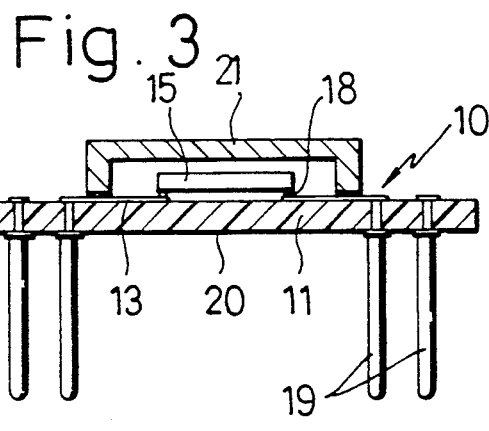
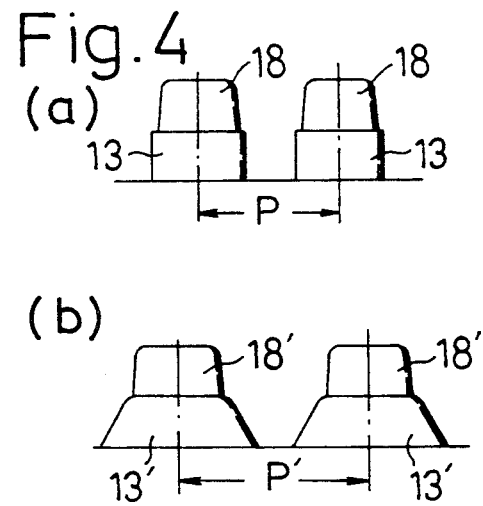
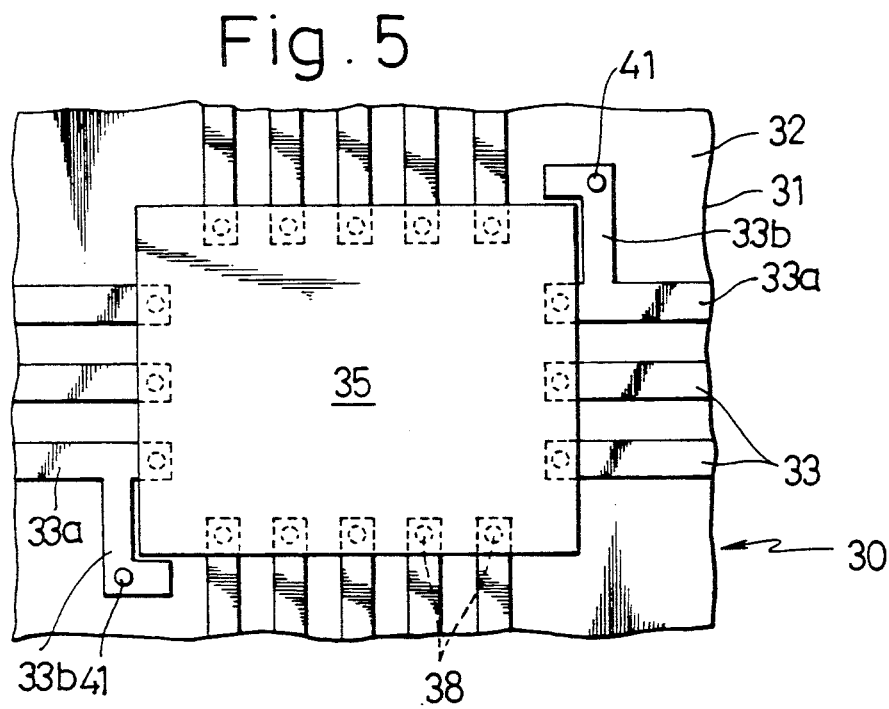
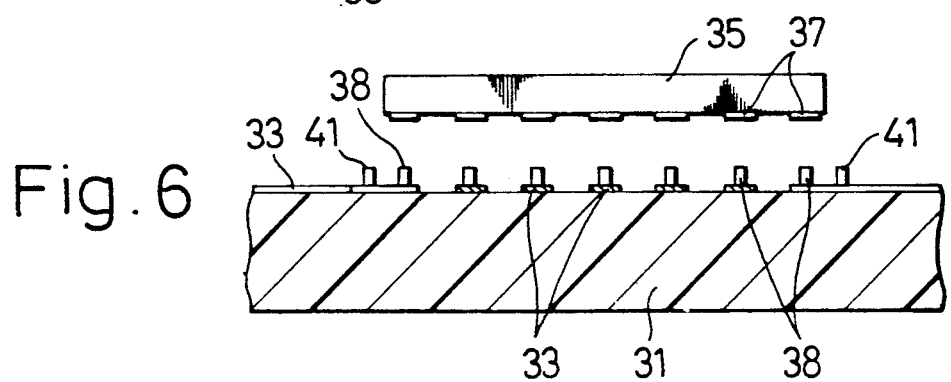

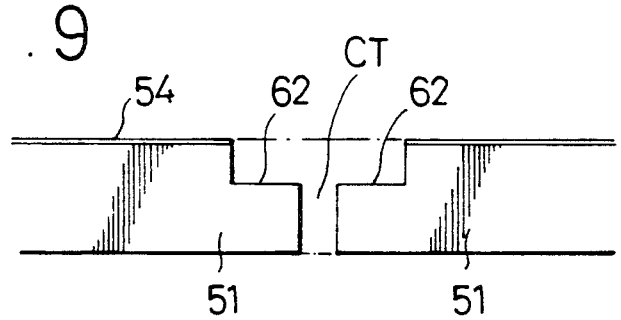
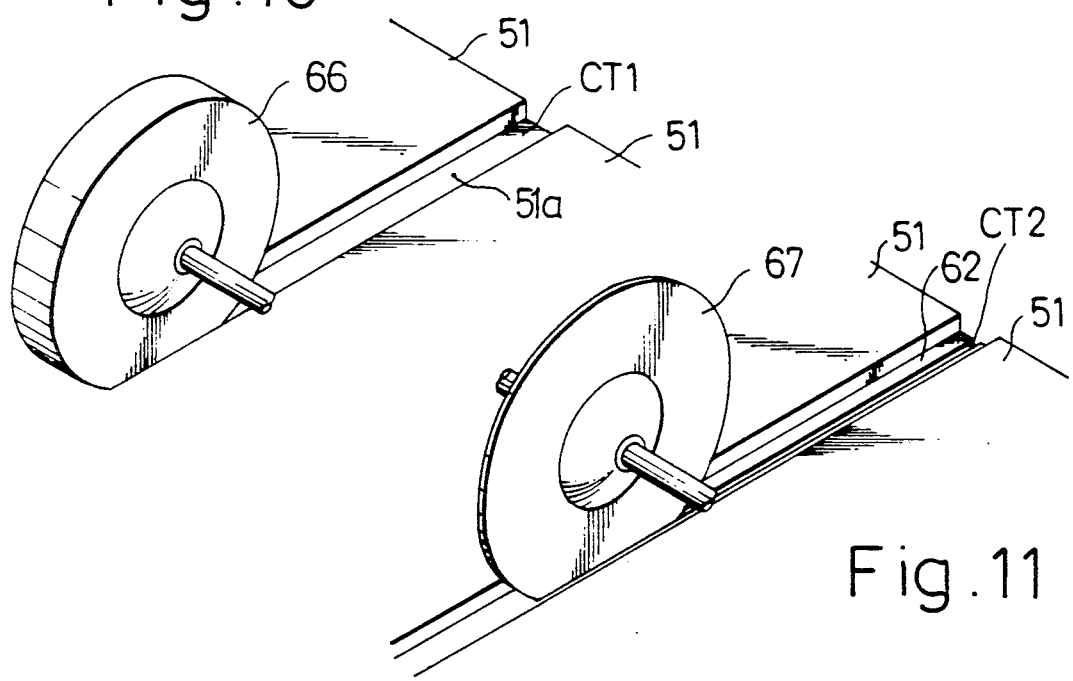
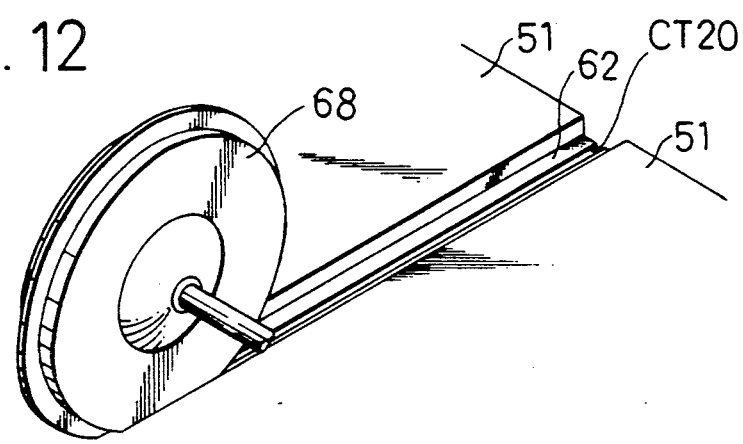

SEMICONDUCTOR DEVICE

This application is a continuation of application Ser. No. 07/196,480, filed May 20, 1988 now abandoned.

TECHNICAL BACKGROUND OF THE INVENTION

This invention relates to semiconductor devices and, more particularly, to a device which comprises a conductor circuit provided on a surface of a ceramic substrate, a plurality of lead pine erected on the substrate and forming input and output terminals connected to the conductor circuit, and an IC chip mounted onto the substrate as connected to the conductor circuit.

The semiconductor device according to the present invention is effectively utilizable as, for example, a semiconductor package and the like.

DISCLOSURE OF PRIOR ART

One of the semiconductor devices of the kind referred to has been disclosed in U.S. Pat. No. 3,730,969 to Robert L. Buttle et al, in which the ceramic substrate is formed in three layers including a circuit pattern card, a plurality of pins mounted to the substrate in connection with a circuit pattern on the card, and a mounting part for an electronic part such as an IC chip defined in the center of the circuit pattern so that a package capable of mounting the electronic part can be provided.

While Buttle et al do not refer concretely to the connection of the electronic part to the circuit pattern, a wire bonding method is generally employed therefor, in which respective conductive parts of the circuit pattern and terminals of the electronic part are connected through wire bondings. On the other hand, there has been a tendency for the number of pads, that is, electrodes of the electronic part, to increase, thus causing the number of wire bonding connection to be increased, whereby there has arisen a problem that the connection work is made complicated and the required working time and costs have increased as a result.

In order to eliminate the foregoing problem, there has been suggested to employ, instead of the wire bonding, such a gang-bonding method for connecting the circuit pattern with the semiconductor device through bumps, that is, projected electrodes as disclosed in, for example, U.S. Pat. No. 4,193,082 to William E. Dougherty or Japanese Patent Application Laid-Open Publication No. 62-124748 of the present inventors. According to this method, the connection between the conduction parts of the circuit pattern and the terminals of the IC chip is carried out only by contacting them through the bumps with one another or, in other words, any increased number of the electrodes of the IC chip still can be subjected to a simultaneous connection throughout, so that the connection work will be simplified and the required time therefor can be shortened to a large extent.

In this known gang-bonding method, however, the fact that the conduction parts of the circuit pattern are formed by an application of a conductor paste onto the substrate results in downwardly increased bulging or bottomwise expansion specifically where the bumps are provided (e.g., see the expanding sides 13a' in FIG. 4b), to render the sides of the applied paste non-perpendicular with respect to the substrate surface. As a result, the higher the bump is made, the larger the bottom area of the applied paste becomes, and the conduction parts are caused to occupy a larger area than necessary. Accordingly, there remains a problem that a high integration of the IC chip cannot be achieved because neither the circuit density nor the corresponding number of pads of the IC chip can be sufficiently increased. While it is possible to form the bumps on the respective pads of the IC chip, on the other hand, such a technique is not compatible with general-use IC chip obtained through currently employed production line operation, so that another production line for producing the IC chip will be required and the required work will become complicated.

TECHNICAL FIELD

A primary object of the present invention is, therefore, to provide a semiconductor device capable of employing the gang-bonding method and simplifies the connection effect and shortens the required working time, and employs a general-use IC chip, and reduces required manufacturing costs.

According to the present invention, the object can be attained by a semiconductor device comprising a ceramic substrate, a circuit pattern provided on a surface of the substrate and including a plurality of conduction parts, a plurality of lead pine connected to the conduction parts to form their input and output terminals erected on the substrate, and an IC chip mounted on the substrate and connected through a plurality of bumps to the conduction parts, wherein the circuit pattern on the ceramic substrate is formed by etching thereon a conductive thin film.

With the foregoing semiconductor device according to the present invention, the circuit pattern is formed by means of an etching of a conductive thin film so that, even when the bumps are provided to the circuit pattern, the side edges of the conduction parts of the pattern can be prevented from being bottomwise expanded, to be substantially vertical with respect to the substrate surface, and a dense circuit pattern can be formed though the bumps are provided thereto.

Other objects and advantages will be made clear in following description of the invention detailed with reference to preferred embodiments shown in accompanying drawings.

BRIEF EXPLANATION OF THE DRAWINGS

FIG. 3 is a schematic sectioned view of the device of FIG. 1 in a state where a seal member is further provided;

FIGS. 4(a) and 4(b) are explanatory views for the bumps in the device of FIG. 1, and the bumps made by a conductive paste application, respectively;

FIG. 5 is a fragmentary plan view of the semiconductor device in another embodiment of the present invention;

FIG. 6 is a fragmentary sectioned view of the device of FIG. 5;

FIGS. 9-11 are explanatory views of respective steps in which the device of FIG. 7 is prepared; and FIG. 12 is an explanatory view of another preparing step for the device of FIG. 7.

While the present invention is now described with reference to the respective embodiments shown in the accompanying drawings, it will be appreciated that the intention is not to limit the invention only to the embodiments shown but to rather include all alterations, modifications and equivalent arrangements possible within the scope of appended claims.

DISCLOSURE OF PREFERRED EMBODIMENTS

Figure 1:
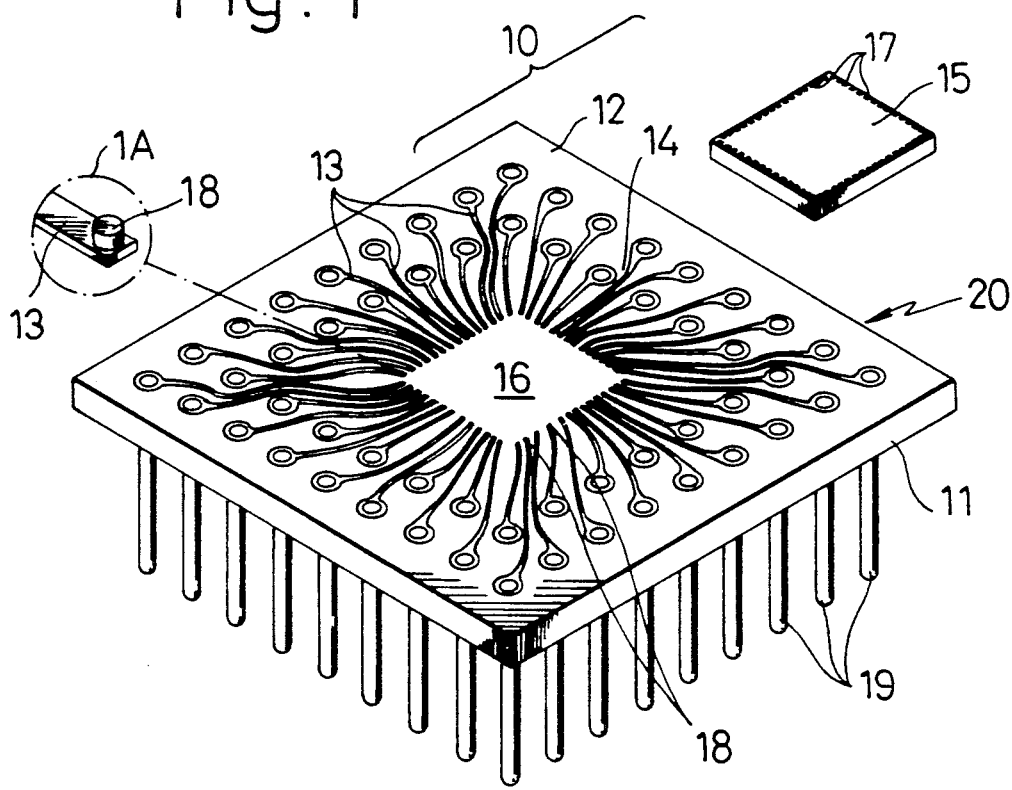
FIG. 1 is a perspective view of the semiconductor device in an embodiment according to the present invention, with an IC chip thereof shown as disassembled, and with a portion denoted by 1A shown fragmentarily as magnified.
Figure 2:
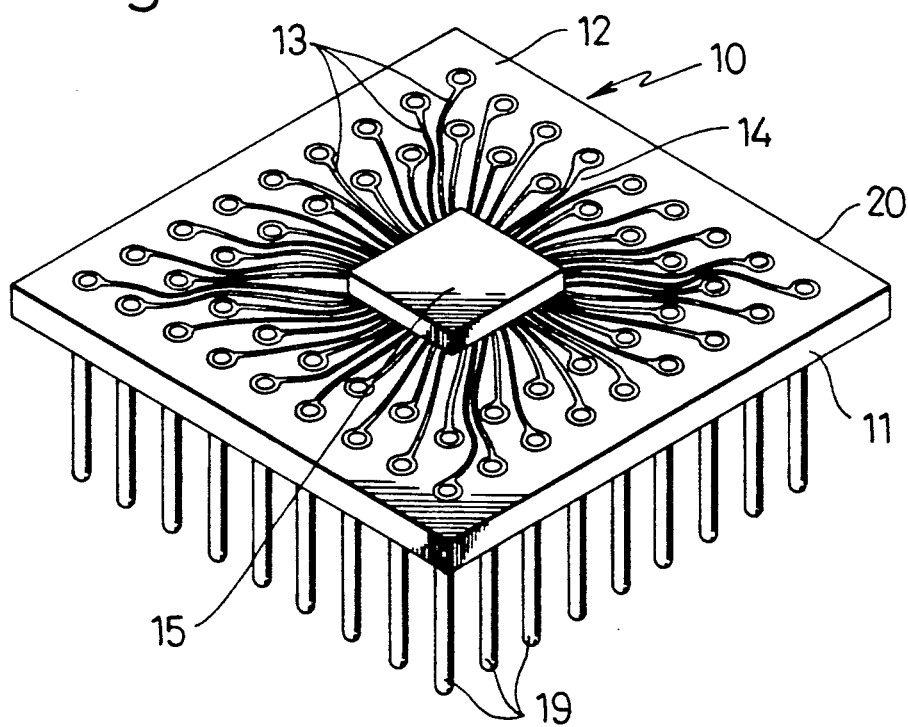
FIG. 2 is a perspective view of the device of FIG. 1, with the IC chip shown as assembled.

Referring to FIGS. 1-3, there is shown an embodiment of the semiconductor device according to the present invention. This semiconductor device 10 includes a ceramic substrate 11 on a surface 12 of which a circuit pattern 14 including a plurality of conduction parts 13 is formed in a predetermined pattern by means of an etching performed with respect to a thin conductor film adhered onto the surface. The circuit pattern 14 is so formed as to define in its central area a1 mounting space 16 for an IC chip 15, and the conduction parts 13 are formed to the provided at their inner ends disposed on respective sides of the mounting space 16 with bumps 18, i.e., projecting electrodes (such as shown as magnified in a circle A in FIG. 11. The bumps are in alignment with a plurality of pads 17 formed along respective sides of the IC chip 15 on a surface thereof which is to be mounted on the surface 12 of the substrate 11. On the surface of the substrate opposite the surface 12, a plurality of lead pins 19 are erected. The pins are passed through the substrate 11 and through outer ends of the conduction parts 13 to form their input and output terminals. Hence, a ceramic pin-grid-array (which shall be hereinafter referred to simply as "PGA") 20 is defined, although the device 10 need not necessarily be of the PGA type.

In providing a thin conductor film on the ceramic substrate 11 to form the circuit pattern 14, it may be possible to employ a variety of conventional measures for forming the thin film on a non-conductive member such as an electroless plating, vacuum evaporation or sputtering process. Alternatively an electrolyte plate process may be combined with any of these processes or process other than those as above may also be employed. For use as the thin film gold or copper may optimumly be employed, but any other material which can be effectively utilizable in the foregoing film forming processes may likewise employed. For the etching process to form the circuit pattern 14, it is preferable to employ a photolithography which allows a dense pattern to be realized, but any other proper measure may be utilized.

The bumps 18 provided at inner ends of the respective conduction parts 13 are formed preferably of such highly conductive material as gold or the like. In providing the bumps 18, preferably, a plating resist having holes corresponding to the bumps 18 to be formed at the inner ends of the respective conduction parts 13 is first provided, and then the bumps 18 are formed through the resist by means of an electroplating with a current passed through the conduction parts 13. Other techniques could be used instead, however. Further, it is preferably that through holes are provided at the outer ends of the conduction parts 13 so that the connecting ends of the lead pins 19 will be brazed to the through holes for the connection with the conduction parts 13.

In the foregoing semiconductor device 10, the circuit pattern 14 is obtained through the etching process of forming the thin film conductor of a metal such as copper or the like so that, as shown specifically in FIG. 4(a). Consequently the conduction parts 13 can possess side edges 13a which are to be substantially perpendicular with respect to the substrate surface so that and the minimum required pitch P for effectively spacing the conduction parts 13 from one another can be remarkably reduced in contrast to a case in which, as shown in FIG. 4(b), the conduction parts 13' as well as the bumps 18' are formed by, for example, applying the conductor paste. The sides 13a' of those parts expand downwardly to cause the minimum required pitch P' of the conductions parts 13' to be enlarged. Accordingly, it will be appreciated that the etching formation of the conduction parts 13 and circuit pattern 14 produces an extremely dense circuit pattern in which intervals between the respective conduction parts 13 having the bumps 18 are small all over the pattern. For instance, as shown in FIG. 4(a), the side surfaces 13(a) of adjacent conduction parts 13 can be spaced apart by a distance which is no greater than a distance between opposite side surfaces 13a of one of the adjacent conduction parts 13. Thus, the ends having the bumps 18 can be densely disposed along the outline of the mounting space 16 for the IC chip 15; the number of pads 17 on the IC chip 15 can be increased; and the IC chip 15 itself can be made to be of a higher integration.

Since the surface of the circuit pattern 14 formed by the etching process maintains a uniform height without fluctuation on the surface 12 of the ceramic substrate 11, the bumps 18 on the pattern 13 can uniformly contact the pads 17 on the IC chip 15, and a highly reliable simultaneous connection between them can be realized. When, in particular, the thin conductor film is to be formed on the ceramic substrate 11 by means of the plating or sputtering process, the film surface roughness is likely to become large enough for requiring a smoothing upon providing the bumps 18. In such event, the thin film surface is polished to be smoothed after the film is formed on the ceramic substrate 11. In such a case, the thin film is initially made thicker than the finally required thickness so as to be, for example, 15-20 $\mu$m thick. Thereafter, the surface of the thin conductor film is mirror finished by means of, for example, an oscillation buff polishing. For this purpose, a buff roll produced by a Japanese firm SUMITOMO 3M can suitably used and, when the thin conductor film surface has been polished to be about a predetermined thickness of 10 $\mu$m and the surface roughness has been measured, the surface could have been smoothed to an extent from Rmax=2.3 $\mu$m to Rmax=1.9 $\mu$m, and the bumps 18 having a flat surface that can intimately contact the pads 17 on the IC chip 15 could have been formed.

Further, the semiconductor device 10 according to the present invention can bee formed into such package type as shown in FIG. 3, in which a seal member 21 is provided on the circuit pattern 14 of the ceramic substrate 11, so as to cover the IC chip 15. As the seal member 21, one which is formed by a metal, synthetic resin or ceramic into a cover member can be used, or even a sealing resin may be provided to cover the element 15. It is of course possible to employ both of such cover member and sealing member as above in combination.

According to another feature of the present invention, there is provided means for accurately positioning the IC chip with respect to the circuit pattern on the ceramic substrate. Referring to FIGS. 5 and 6, constituent members substantially the same as those in the embodiment of FIGS. 1 and 2 are denoted by the same reference numerals as in the embodiment but as added by 20. In the present embodiment of FIGS. 5 and 6, in the conduction parts 33 formed to define the mounting space for the IC chip 35, some conduction parts 33a which are disposed adjacent a diagonal line of the mounting space are provided respectively with a branch conduction part 33b which is extended to a position beyond imaginary extension of the diagonal line, and a positioning bump 41 is erected at a point exactly on the imaginary extension on the branch part 33b. In this case, the positioning bumps 41 are dimensioned to be positioned adjacent corresponding diagonal corners of the element 35 when same is mounted onto the space therefor.

The benefit of the positioning bumps 41 will now be explained. In forming a printed circuit on a substrate, generally, there occurs normally a positional error in a range of 5 to 10 $\mu$m while positioning a mask on the substrate. When the IC chip 35 is positioned with respect to the conduction parts 33, there arises a risk that the size of the positional error between the element 35 and the conduction parts 33 will be increased due to a synergistic action of both positional errors of the conduction parts 33 and the pads 37 on the IC chip 35. In mounting the element 35, between the two positioning bumps 41 and the corresponding diagonal corners of the element 35, respectively, whereby the positioning can be carried out with the precisely located positioning bumps 41 utilized as a reference means, as simultaneously (The bumps 41 are precisely located by virtue of being simultaneously formed with the contacting bumps 38). As a result, the positioning accuracy of the element 35 can be remarkably elevated, and the connection between the conduction parts 33 and the IC chip 35 can be also made highly reliable.

Figure 7:
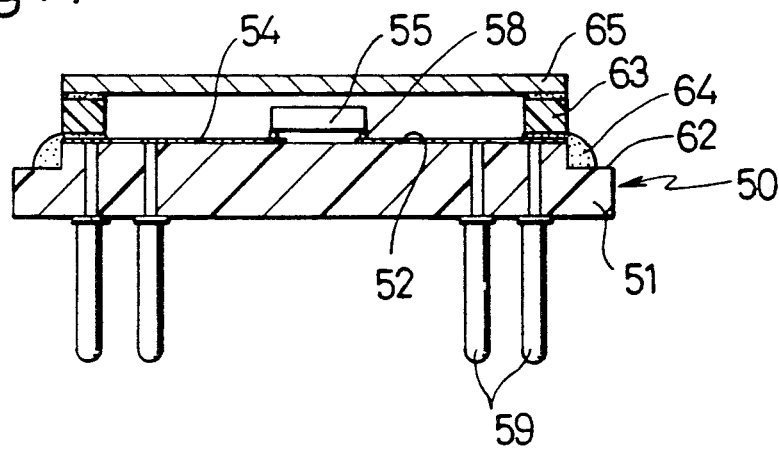
FIG. 7 is a sectioned view of the semiconductor device in still another embodiment of the invention.

According to still another feature of the present invention, there is provided a measure for preventing the circuit pattern from being subjected to any damage likely to occur upon practical use of the semiconductor device. Referring to FIG. 7 showing a further embodiment in which the same constituents as in the embodiment of FIGS. 1 and 2 are denoted by the same reference numerals as in FIGS. 1 and 2 but as added by 40. In the present embodiment, in particular, the ceramic substrate 51 carrying the circuit pattern 54 is partly removed at side edge portions so as to form steps 62.

Figure 8:
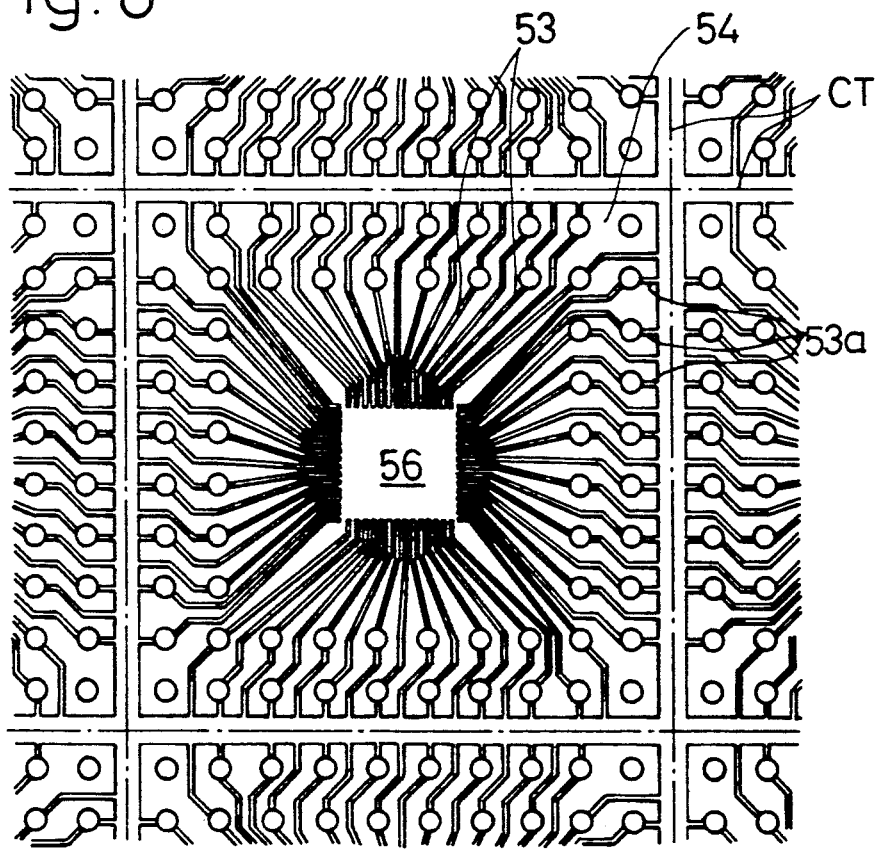
FIG. 8 is an explanatory view of a manner in which the device of FIG. 7 is prepared.

In carrying out a mass production of, for example, the PGA, more specifically, a larger number of the circuit patterns 54 (as compared to the circuit pattern 14 as shown in FIGS. 1 and 2) are formed on a larger ceramic substrate material as shown in FIG. 8 (while only a part of many patterns is shown therein), and the substrate material is cut along cutting lines CT into respective pieces of the circuit patterns 54. In this event, the outermost end portions 53a of the conduction parts 53 in the respective patterns 54 remain along cut sides so that there will arise a risk that a static electricity is applied to the circuit pattern 54 when the semiconductor device 50 is assembled into any electronic apparatus or the like as held manually. The applied static electricity is likely to cause the mounted IC chip 55 on the circuit pattern 54 to be readily damaged, and any damage at the outermost end portions 53a of the pattern 54 may cause a corrosion to occur in the pattern 54. Accordingly, the partial removal of the ceramic substrate 51 at its side portions serves to recess the outermost end portions 53a present adjacent the cut edge sides, so that the circuit pattern 54 will be prevented from being affected even when the device 50 is manually held at the steps 62 where no conduction parts present (see also FIG. 9).

In removing the side edge portions of the ceramic substrate 51, a thick rolling blade 66 is initially employed as shown in FIG. 10 to form a recess 51a at removal zone CT1 along the cutting lines CT in the larger substrate material as in FIG. 8, removing the outermost end portions 53a on both sides of the line CT of two adjacent ceramic substrates 51. Then, a thinner rolling blade 67 of a sufficiently larger diameter is employed to remove a central removal zone CT2 in the recess 51a, so as to cut the substrate material into the respective substrates 51, whereby the ceramic substrates 51 with the outermost end portions 53a removed are obtained. When such a blade 68 of a type having double cutting edges, including a smaller diametered, thicker cutting edge and a larger diametered, central thinner cutting edge, as shown in FIG. 12 is employed to cut and remove double removal zone CT20, the formation of the step 62 by the removal of the outermost end portions 53a of the conduction parts 53 as well as the cutting of the substrate material into the respective ceramic substrates 51 can be simultaneously realized at one step.

In the embodiment of FIG. 7, too, it is possible to obtain the package type device, in which event a frame member 63 enclosing the whole of the circuit pattern 54 on the ceramic substrate 51 is mounted as adhered with an adhesive agent to the substrate 51, a layer 64 of the adhesive agent is formed across the step 62, and a cover member 65 is secured onto the frame member 63. In contrast to the foregoing embodiment of FIG. 3 in which the IC chip only is enclosed, therefore, the whole of the circuit pattern 54 can be packed, while the adhesive layer 64 covers cut end edges of the conduction parts 53, so that any damage of the IC chip 55 as well as any corrosion of the conduction parts 53 can be effectively prevented from occurring.

In the embodiment of FIG. 7, other arrangements and operation are the same as in the embodiment of FIGS. 1 and 2.

What is claimed as our invention is:

1. A semiconductor device comprising a ceramic substrate on a surface of which is disposed a plurality of conduction parts formed of an etched film, said conduction parts having side surfaces which are substantially perpendicular to said surface of said substrate, a plurality of lead pins projecting from said substrate and connected to said conduction parts for forming input and output terminals, and an IC chip mounted on said surface of said substrate and electrically contacting said conduction parts by a plurality of contacting bumps to minimize the required spacing between adjacent conduction parts, said contacting bumps being provided on said conduction parts, said side surfaces of each of said conduction parts defining a width at a region thereof where a respective one of said contacting bumps is located, each of said bumps being no wider than said width, said contacting bumps being provided on said conduction parts, the conduction parts forming a dense pattern on the substrate, the side surfaces of adjacent conduction parts being spaced apart by a distance which is no greater than the width between the side surfaces of one of the adjacent conduction parts, the conduction parts having uppermost surfaces spaced from the substrate by a uniform height and the contacting bumps comprising electroplated conductive material having uppermost surfaces which simultaneously contact pads on the IC chip when the IC chip is mounted on the substrate.

2. A semiconductor device according to claim 1, wherein said contacting bumps are provided on flat polished surface portions of said conduction parts.

3. A semiconductor device according to claim 1, wherein said conduction parts form a circuit pattern which defines a mounting space for said IC chip, said circuit pattern being provided with a pair of positioning bumps for positioning the IC chip, the positioning bumps being located at symmetrical positions across said mounting space and disposed outside of the IC chip, said positioning bumps being provided on said circuit pattern simultaneously with said contacting bumps.

4. A semiconductor device according to claim 1, wherein said ceramic substrate includes steps formed a long side edges thereof with the outermost end portions of said conduction parts located inwardly from outermost edges of said steps.

* * * * *